United States Patent
Wu et al.

(10) Patent No.: US 9,153,535 B1
(45) Date of Patent: Oct. 6, 2015

(54) LINE LAYOUT AND METHOD OF SPACER SELF-ALIGNED QUADRUPLE PATTERNING FOR THE SAME

(71) Applicant: MACRONIX International Co., Ltd., Hsinchu (TW)

(72) Inventors: Chih-Yuan Wu, Hsinchu (TW); Kuang-Wen Liu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/523,591

(22) Filed: Oct. 24, 2014

(51) Int. Cl.
*H01L 21/4763* (2006.01)
*H01L 21/44* (2006.01)
*H01L 23/528* (2006.01)

(52) U.S. Cl.
CPC ............................ *H01L 23/528* (2013.01)

(58) Field of Classification Search
USPC .................................................. 438/597–688
See application file for complete search history.

(56) References Cited

U.S. PATENT DOCUMENTS

| | | | | |
|---|---|---|---|---|
| 7,495,294 | B2 * | 2/2009 | Higashitani | 257/390 |
| 8,003,544 | B2 * | 8/2011 | Sato et al. | 438/717 |
| 2010/0155959 | A1 * | 6/2010 | Park et al. | 257/773 |
| 2010/0244269 | A1 * | 9/2010 | Kim | 257/773 |
| 2012/0168841 | A1 * | 7/2012 | Chen et al. | 257/314 |

* cited by examiner

*Primary Examiner* — Karen Kusumakar
(74) *Attorney, Agent, or Firm* — J.C. Patents

(57) ABSTRACT

A line layout method includes: forming i core layers each including a main layer that extends in a first direction and has a first end and a second end, and an end layer that is connected with the first end of the main layer and protrudes in a second direction; forming a first spacer on a sidewall of the core layer; removing the core layers; and forming 2i auxiliary patterns. i is an integer equal to or greater than 1. The auxiliary patterns extend in the first direction and are spaced and arranged in the first direction. In a region corresponding to the end layer, a portion not overlapping the auxiliary patterns has an I-beam shape.

20 Claims, 15 Drawing Sheets

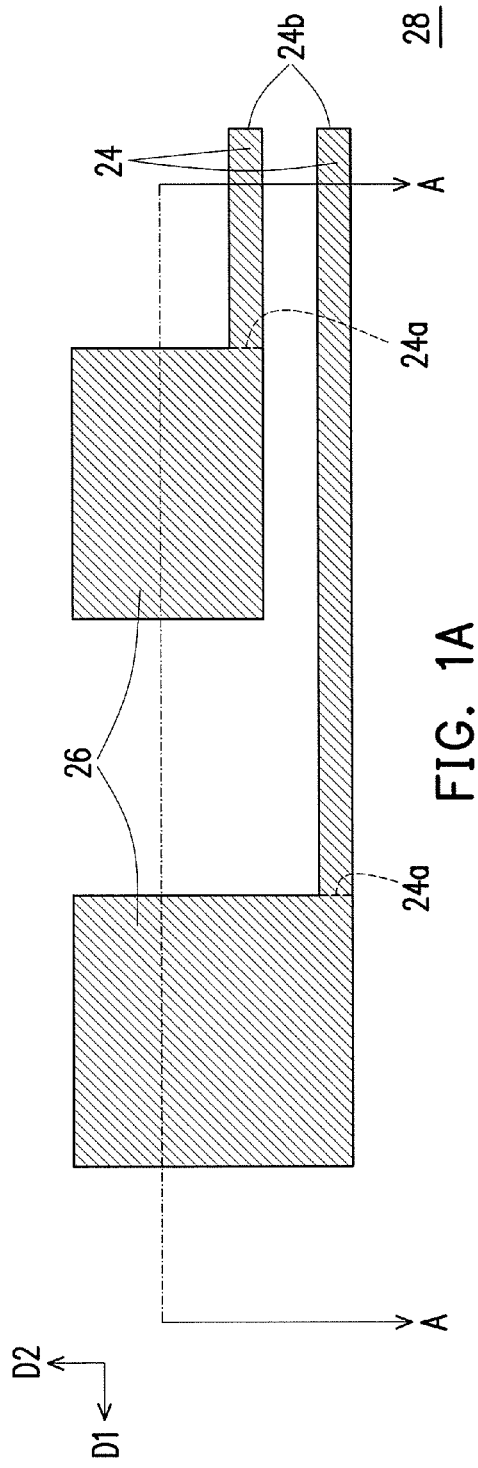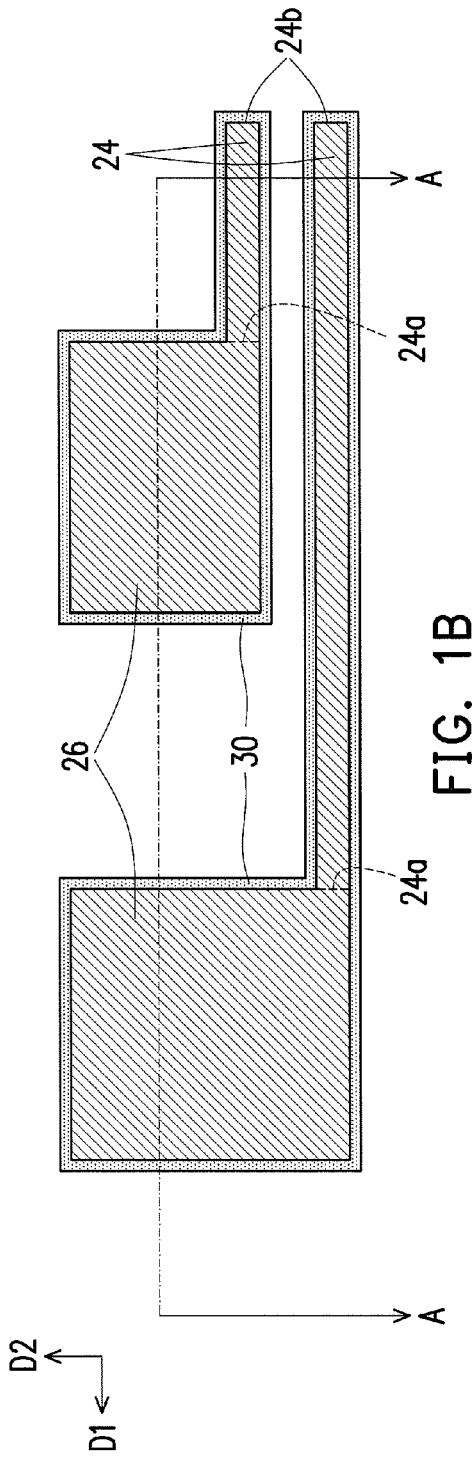

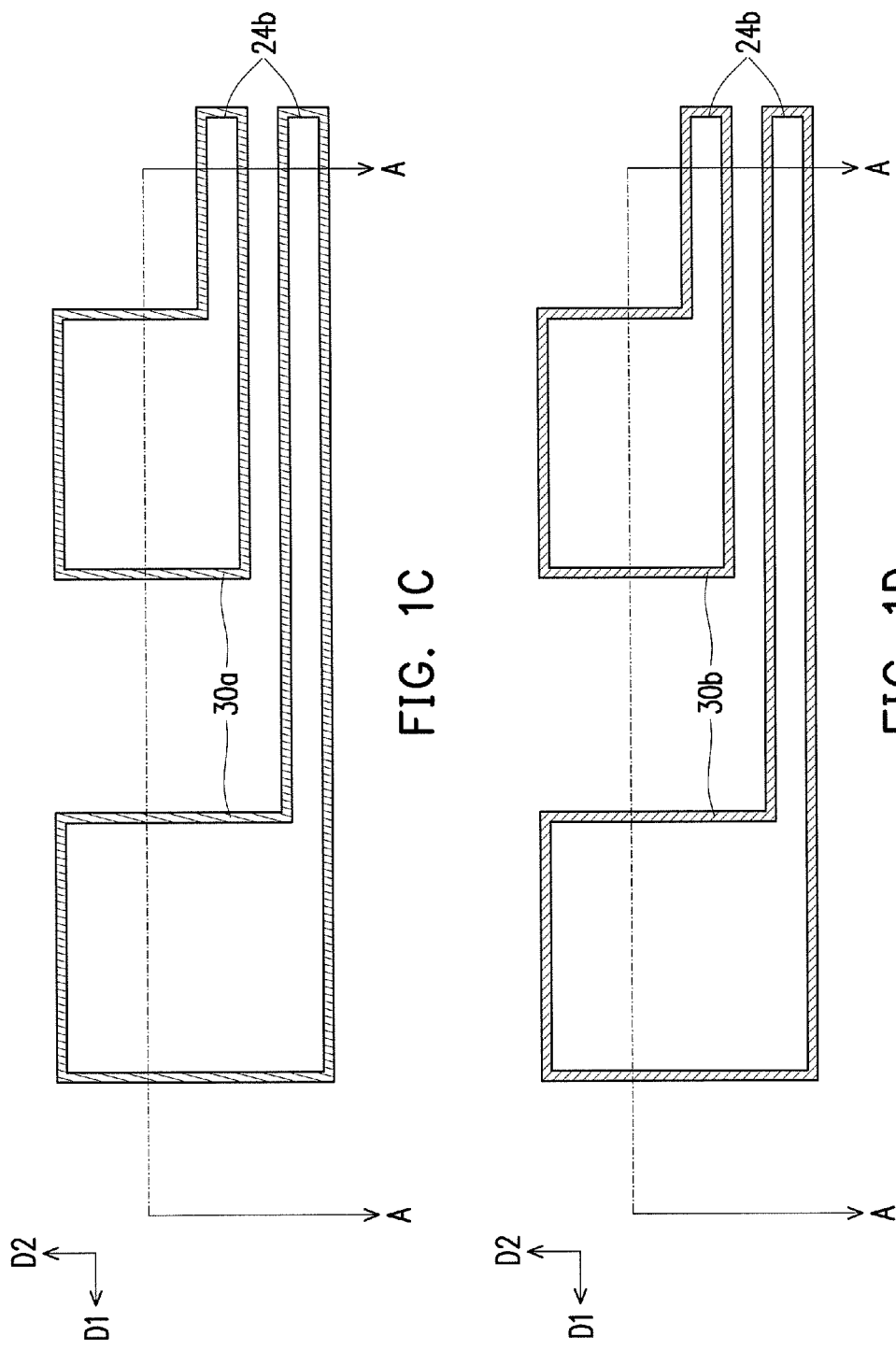

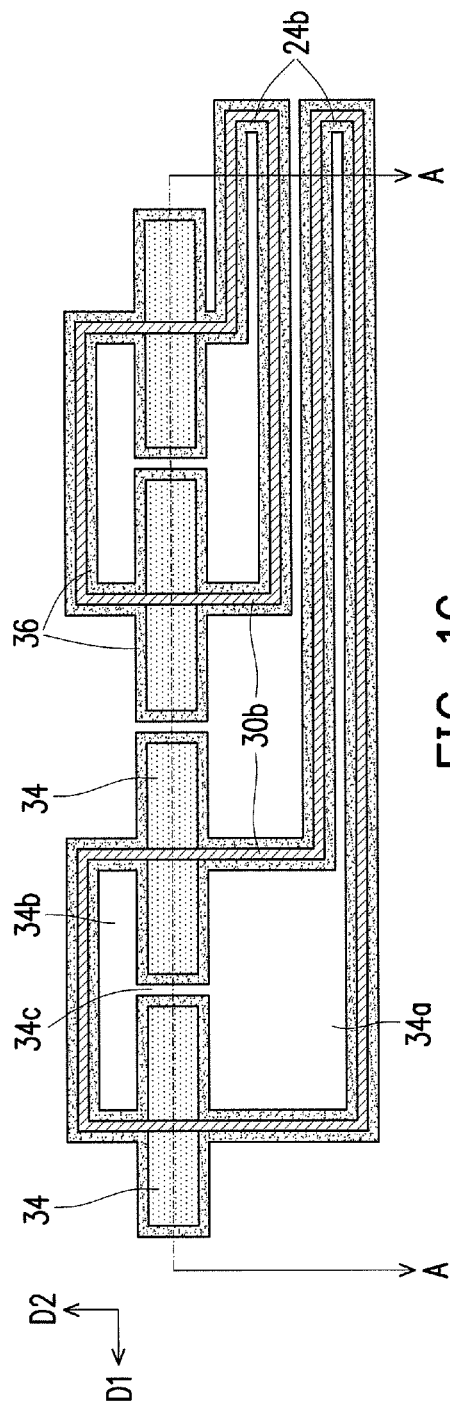
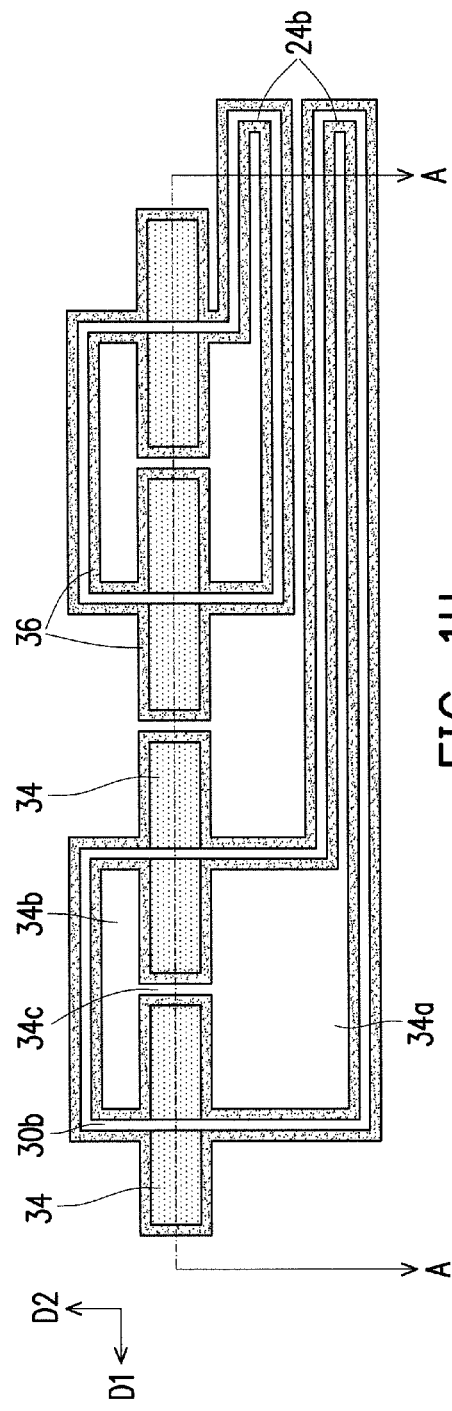

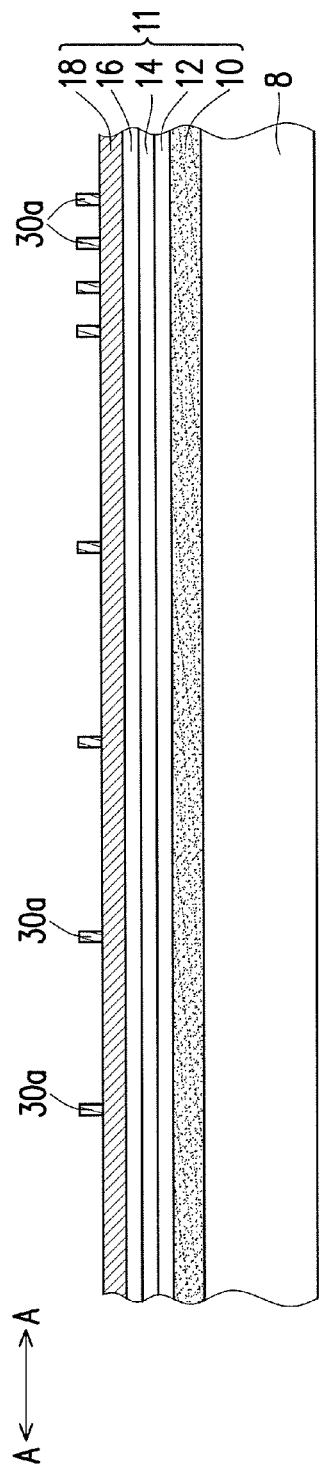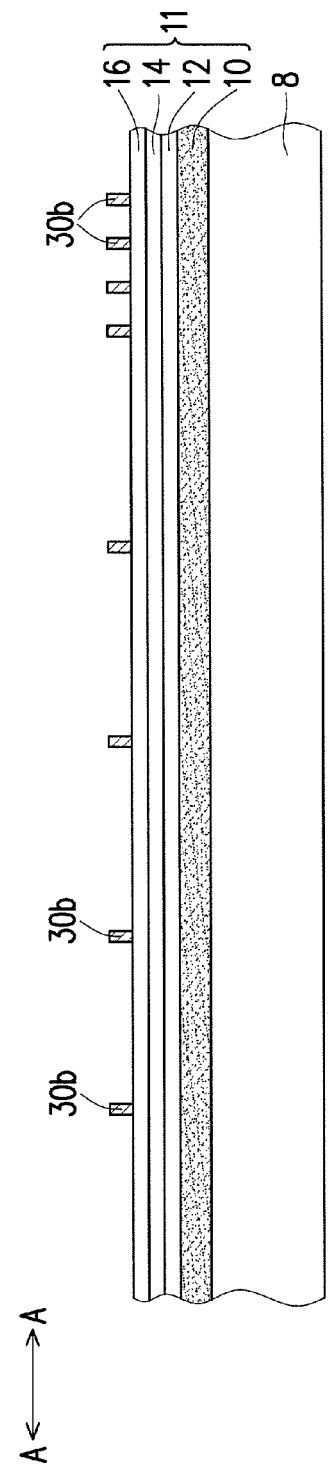
FIG. 2C
FIG. 2D

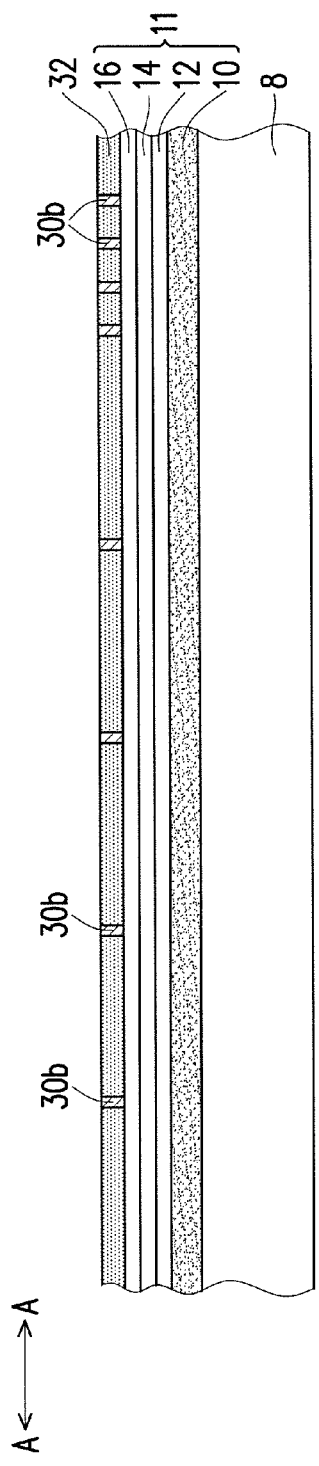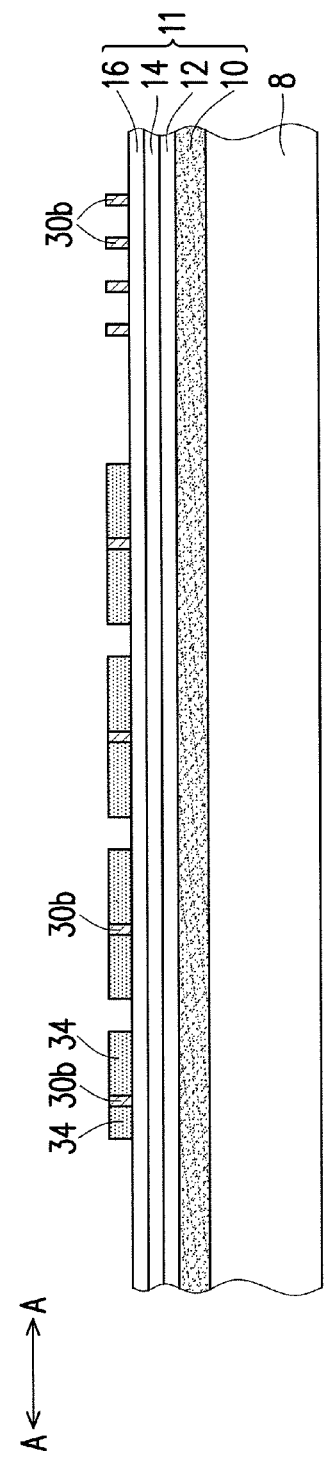

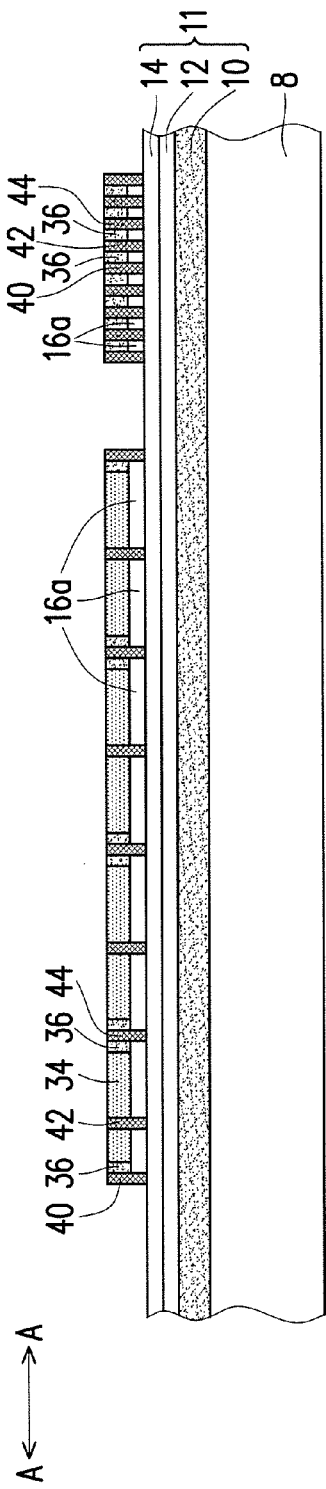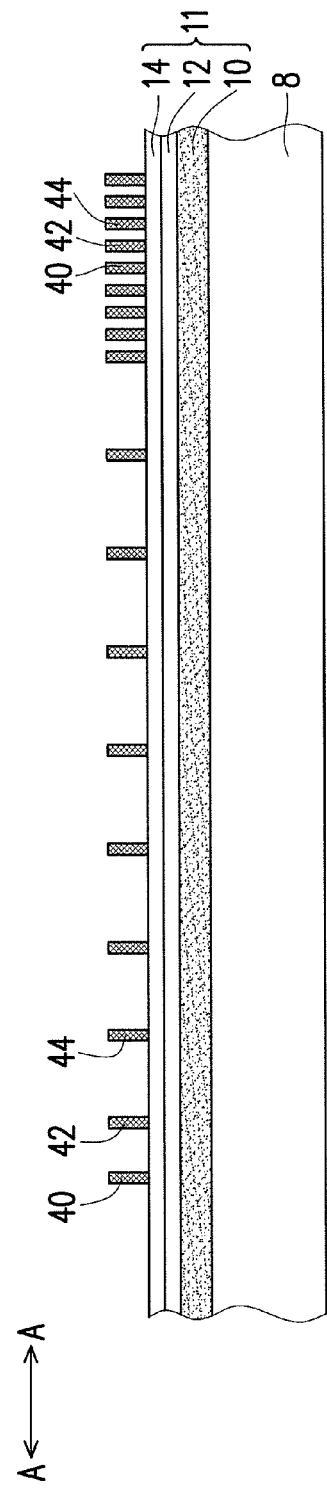
FIG. 2I
FIG. 2J

LINE LAYOUT AND METHOD OF SPACER SELF-ALIGNED QUADRUPLE PATTERNING FOR THE SAME

BACKGROUND OF THE INVENTION

1. Field of the Invention

The invention relates to a line layout and a line layout method and more particularly relates to a spacer self-aligned quadruple patterning (SAQP) process and a line layout.

2. Description of Related Art

Due to the decreasing sizes of semiconductor devices, exposure technology that uses extreme ultraviolet (EUV) having a short wavelength of 13.5 nm has been proposed. However, such exposure technology requires high equipment costs and is not applicable for mass production. Therefore, it is expected to use the spacer self-aligned double patterning (SADP) technology to overcome the problems of the EUV exposure technology.

The spacer self-aligned double patterning is a technique that forms spacers on the sidewall of the first mask pattern, forms the second mask pattern between the spacers, and then removes the spacers. Through self-aligned double patterning, the spacing can be reduced to half of the line pitch of the general lithography and etching process.

In addition, spacer self-aligned quadruple patterning technology has been proposed for further reducing the spacing on the basis of the self-aligned double patterning. The spacer self-aligned quadruple patterning is a technique that performs the self-aligned double patterning twice. However, the lines fabricated by the self-aligned quadruple patterning technique usually have much smaller spacing between the line ends, which may result in improper electrical connection between the lines. As an attempt to solve the above problem, currently the lithography and etching process is carried out several times in the spacer self-aligned quadruple patterning process in most cases. The lithography and etching processes effectively increase the spacing between line ends but raise the production costs and the fabrication complexity.

In view of the above, a technique that can effectively increase the spacing between line ends with fewer lithography processes is desired.

SUMMARY OF THE INVENTION

The invention provides a line layout and a spacer self-aligned quadruple patterning method for the line layout, adapted for effectively increasing spacing between line ends with use of fewer lithography processes.

The invention provides a spacer self-aligned quadruple patterning method for a line layout, including: forming i core layers each including a main layer that extends in a first direction and has a first end and a second end, and an end layer that is connected with the first end of the main layer and protrudes in a second direction; forming a first spacer on a sidewall of each of the core layers; removing the core layers; and forming 2i auxiliary patterns, wherein i is an integer equal to or greater than 1, and the auxiliary patterns extend in the first direction and are spaced and arranged in the first direction. In a region corresponding to the end layer, a portion not overlapping the auxiliary patterns has an I-beam shape, which includes a first region adjacent to a region corresponding to the main layer, a second region not adjacent to the region corresponding to the main layer, and a third region connecting the first region and the second region.

In an embodiment of the invention, the area of the first region increases as a distance between the first region and the second end increases, when measured in the first direction starting from the second end.

In an embodiment of the invention, a length of the first region in the second direction increases as the distance between the first region and the second end increases, and a length of the first region in the first direction is substantially fixed.

In an embodiment of the invention, the area of the second region is substantially fixed.

In an embodiment of the invention, the auxiliary patterns are substantially aligned in the first direction.

In an embodiment of the invention, the auxiliary patterns have substantially equal lengths in the second direction.

In an embodiment of the invention, the spacer self-aligned quadruple patterning method further includes: forming a stack structure including a plurality of pattern receiver layers; forming the core layers on the stack structure; and transferring a pattern of the first spacer to one or more of the pattern receiver layers to form a first spacer pattern layer before forming the auxiliary patterns.

In an embodiment of the invention, the spacer self-aligned quadruple patterning method further includes: forming a second spacer on a sidewall of the first spacer pattern layer and a sidewall of each of the auxiliary patterns; forming a third spacer and a fourth spacer on a sidewall of the second spacer, wherein the third spacer is located in the fourth spacer; removing the second spacer and the auxiliary patterns to form a closed loop; and removing a portion of the closed loop to cut the closed loop in a region corresponding to the auxiliary patterns and in a region corresponding to the second end.

In an embodiment of the invention, spacing between the auxiliary patterns is less than double of a width of the third spacer.

In an embodiment of the invention, before the step of removing the portion of the closed loop, the spacer self-aligned quadruple patterning method further includes: removing the first spacer pattern layer before forming the third spacer and the fourth spacer; patterning one or more of the pattern receiver layers with the second spacer and the auxiliary patterns as masks to form a patterned layer; forming a second spacer pattern layer at a location corresponding to the first spacer pattern layer; and removing the second spacer, the auxiliary patterns, and the patterned layer.

In an embodiment of the invention, the step of removing the portion of the closed loop includes: removing a portion of the second spacer pattern layer, a portion of the third spacer, and a portion of the fourth spacer in a first predetermined removal region and a second predetermined removal region, wherein the first predetermined removal region extends in the first direction and covers a portion of the region corresponding to the auxiliary patterns and a portion of the region corresponding to the end layer, and the first predetermined removal region does not cover the region corresponding to the main layer; and the second predetermined removal region covers a region corresponding to the second end of the main layer, and the second predetermined removal region does not cover the region corresponding to the end layer and the region corresponding to the auxiliary patterns.

The invention further provides a line layout, including: 4i+1 lines, wherein i is an integer equal to or greater than 1, and each of the lines includes a main portion extending in a first direction, and a connection portion connected with the main portion and extending in a second direction, wherein the main portions of a portion of the lines include a loop structure respectively.

In an embodiment of the invention, when counted in the first direction starting from an endpoint of the main portion of each of the lines, the main portions of odd-numbered lines include the loop structure respectively, wherein a first line of the lines does not include the loop structure.

In an embodiment of the invention, the area surrounded by the loop structure increases as a distance between the loop structure and the endpoint of the main portion of each of the lines increases.

In an embodiment of the invention, a length of the loop structure in the second direction increases as the distance between the loop structure and the endpoint of the main portion of each of the lines increases, and a length of the loop structure in the first direction is substantially fixed.

In an embodiment of the invention, a length of the connection portion of each of the odd-numbered lines in the second direction is substantially fixed.

In an embodiment of the invention, a length of the connection portion of each of even-numbered lines in the second direction increases as a distance between the connection portion and the endpoint of the main portion of each of the lines increases.

In an embodiment of the invention, the first line of the lines includes a protruding portion at an intersection of the connection portion and the main portion, and the protruding portion protrudes toward the connection portion of the adjacent line.

In an embodiment of the invention, a last line of the lines includes a stepped structure.

In an embodiment of the invention, each of the even-numbered lines has an L shape.

Based on the above, in the invention, the auxiliary patterns are formed in the region corresponding to the end layer and the portion not overlapping the auxiliary patterns in the region corresponding to the end layer is formed in the I-beam shape. Thus, the spacing between the line ends is increased effectively with use of fewer lithography processes.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1A to FIG. 1M are schematic top views illustrating a line layout method according to an embodiment of the invention.

FIG. 2A to FIG. 2L are schematic cross-sectional views of FIG. 1A to FIG. 1L along the line A-A.

DESCRIPTION OF THE EMBODIMENTS

FIG. 1A to FIG. 1M are schematic top views illustrating a line layout method according to an embodiment of the invention. FIG. 2A to FIG. 2L are schematic cross-sectional views of FIG. 1A to FIG. 1L along the line A-A.

In the embodiments of the invention, a spacer self-aligned quadruple patterning method is performed for forming a line layout.

Figure 1E:
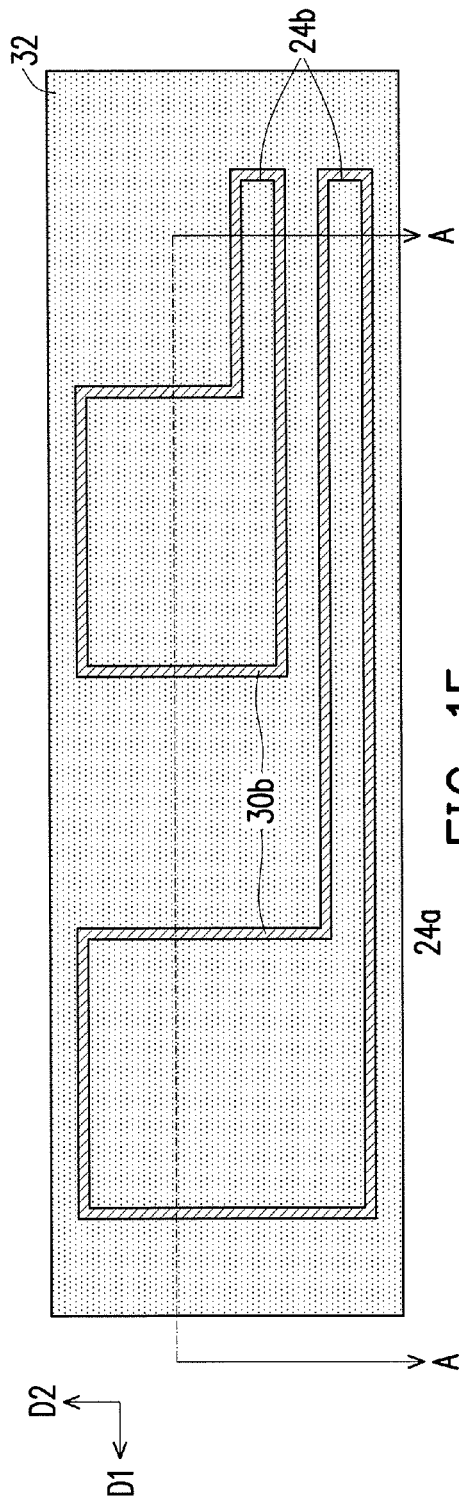
Figure 1F:
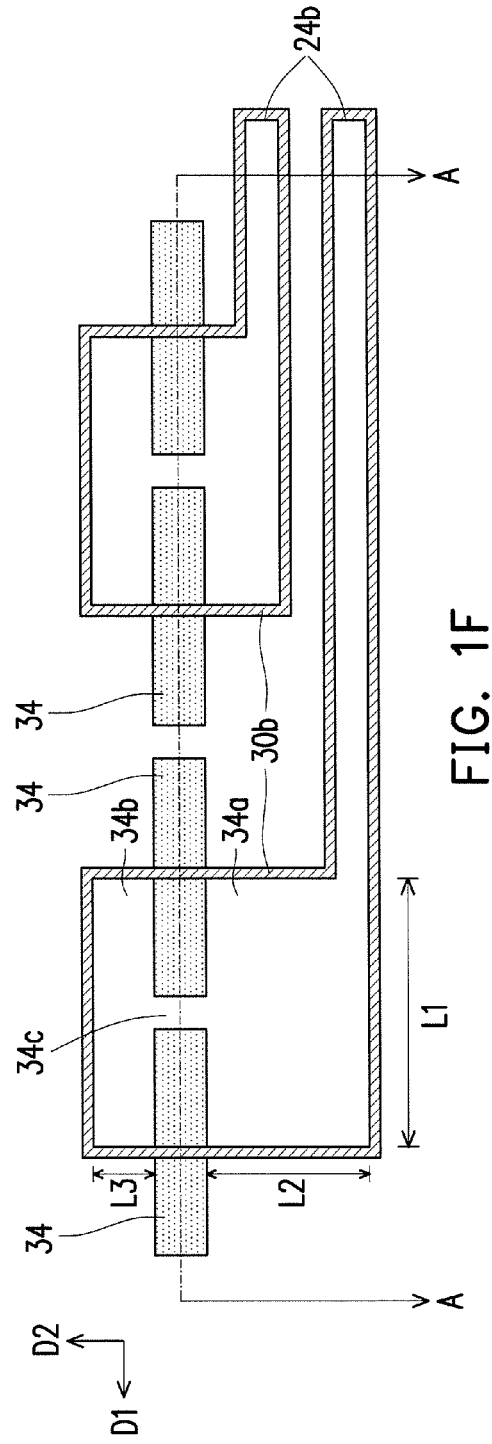
Figure 2A:
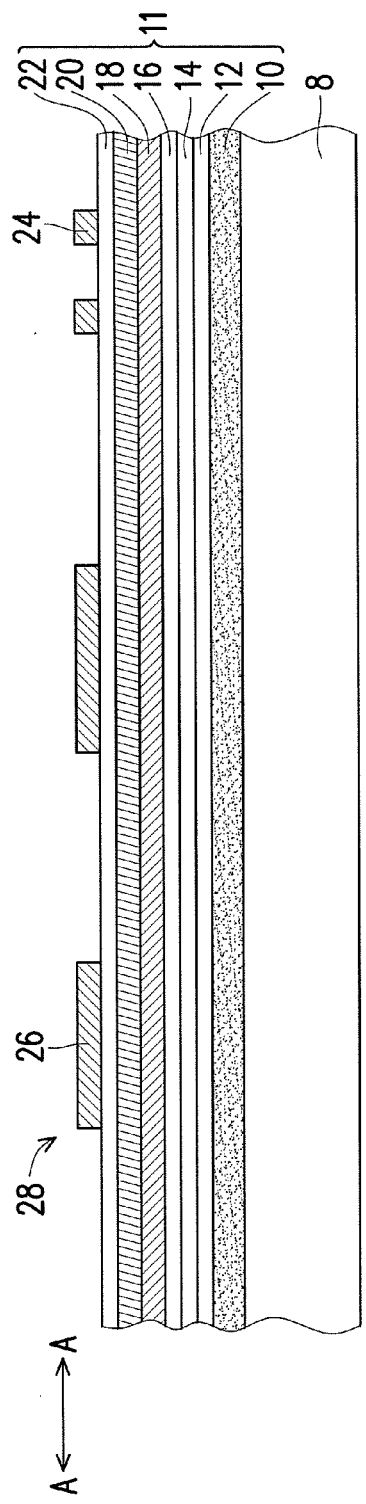
Figure 2B:
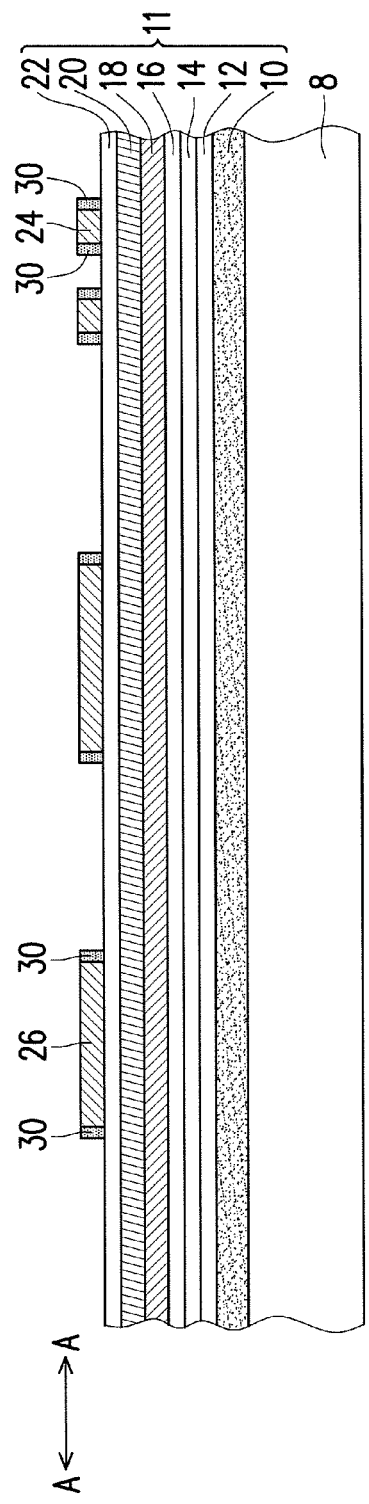

With reference to FIG. 1A and FIG. 2A, a stack structure 11 is formed on a substrate 8 first. The substrate 8 is a semiconductor substrate, a semiconductor compound substrate, or a semiconductor over insulator (SOI) substrate, for example. The semiconductor is IVA group atoms, such as silicon or germanium, for example. The semiconductor compound is formed of IVA group atoms, such as silicon carbide or silicon germanium, or formed of IIIA group atoms and VA group atoms, such as gallium arsenide, for example. The stack structure 11 includes a target layer 10 and a plurality of pattern receiver layers disposed on the target layer 10. A material of the pattern receiver layers may be an oxide, a nitride, polysilicon, an organic material, or a combination thereof. In an embodiment, the stack structure 11 is formed by laminating a target layer 10, an oxide layer 12, a first silicon nitride layer 14, a polysilicon layer 16, a second silicon nitride layer 18, an organic material layer 20, and a third silicon nitride layer 22 in sequence from the bottom to the top, for example. A material of the target layer 10 may be a conductor, which includes a metal or a metal alloy, such as copper, aluminum, or a combination thereof, for example. A material of the oxide layer 12 is an oxide of tetraethyl orthosilicate, silane, or a combination thereof, for example. A method of forming the aforementioned layers includes chemical vapor deposition or physical vapor deposition, for example. In this embodiment, each layer above the target layer 10 is adapted for receiving a pattern of an upper layer and serves as a mask for transferring a pattern to a lower layer. Even though the materials and sequence of arrangement of the layers in the stack structure 11 have been specified above, the invention is not limited thereto. The materials of the layers, the number of the layers, and the sequence of arrangement may be adjusted as appropriate according to the actual requirements as long as the etching selectivity in an etching process for pattern transfer between the layers is sufficient for transferring a desired pattern to the target layer 10.

With reference to FIG. 1A and FIG. 2A, then, i core layers 28 are formed on the stack structure 11. i is an integer equal to or greater than 1. Each of the core layers 28 includes: a main layer 24 and an end layer 26. The main layer 24 has a first end 24a and a second end 24b extending in a first direction D1. The end layer 26 is connected with the first end 24a of the main layer 24 and protrudes in a second direction D2. The first direction D1 is an X direction and the second direction D2 is a Y direction, for example. However, the invention is not limited thereto. A material of the core layers 28 is an organic material, an inorganic material, or a combination thereof, for example. The organic material is amorphous carbon, hydrocarbon, or a combination thereof, for example. The inorganic material is silicon oxide, oxynitride, or a combination thereof, for example. A method of forming the core layers 28 includes forming a core material layer (not shown) and then performing a patterning process on the core material layer, for example.

With reference to FIG. 1A, FIG. 1B, FIG. 2A and FIG. 2B, next, a first spacer 30 is formed on a sidewall of each of the core layers 28. A width of the first spacer 30 is in a range of 10 nm to 40 nm, for example. A material of the first spacer 30 is silicon dioxide, silicon nitride, or a combination thereof, for example. A method of forming the first spacer 30 includes forming a spacer material layer (not shown) and then performing an anisotropic etching process thereon, for example.

With reference to FIG. 1B, FIG. 1C, FIG. 1D, FIG. 2B, FIG. 2C, and FIG. 2D, thereafter, the core layers 28 are removed. A method of removing the core layers 28 may include performing a dry stripping process, a dry etching process, a wet stripping process, a wet etching process, or a combination thereof. Then, a pattern of the first spacer 30 is transferred to one or more of the pattern receiver layers, so as to form a first spacer pattern layer 30b. More specifically, a method of transferring the pattern includes forming the pattern corresponding to the location of the first spacer 30 in the pattern receiver layer of the stack structure 11 by performing an etching process with the first spacer 30 as a mask, and then removing the first spacer 30 that serves as the mask, for example. In an embodiment, the pattern of the first spacer 30 is first transferred to the third silicon nitride layer 22 and the organic material layer 20 under the first spacer 30 by performing the etching process with the first spacer 30 as a mask, and then, the first spacer 30 is removed to form a spacer pattern 30a. Next, the formed pattern is transferred to the second silicon nitride layer 18 thereunder by performing an etching process with the spacer pattern 30a as a mask, and then, the spacer pattern 30a is removed to form the first spacer pattern layer 30b. In other words, the pattern transfer process is performed twice, so as to transfer the pattern of the first spacer 30 to the second silicon nitride layer 18. A method of removing the first spacer 30 and the spacer pattern 30a may include performing a dry etching process, a wet etching process, or a combination thereof.

With reference to FIG. 1E and FIG. 2E, next, an auxiliary pattern material layer 32 is formed on the polysilicon layer 16 to cover a sidewall of the first spacer pattern layer 30b. The auxiliary pattern material layer 32 includes an oxide, nitrides, or a combination thereof. The oxide is silicon oxide, silicon oxynitride, or a combination thereof, for example. A method of forming the auxiliary pattern material layer 32 includes chemical vapor deposition or physical vapor deposition, for example.

With reference to FIG. 1E, FIG. 1F, FIG. 2E, and FIG. 2F, thereafter, 2i auxiliary patterns 34 (i is an integer equal to or greater than 1) are formed by performing a patterning process on the auxiliary pattern material layer 32. Each of the auxiliary patterns 34 extends in the first direction D1 and are spaced and arranged in the first direction D1. In an embodiment, the auxiliary patterns 34 are substantially aligned in the first direction D1, or the auxiliary patterns 34 may not be aligned if a range of spacing of line ends, which are to be formed in subsequent processes, is not affected. In an embodiment, the auxiliary patterns 34 have substantially equal lengths in the second direction D2. More specifically, a length of each of the auxiliary patterns 34 in the first direction D1 is in a range of 80 nm to 500 nm, a length of each of the auxiliary patterns 34 in the second direction D2 is in a range of 80 nm to 500 nm, for example. The spacing between the auxiliary patterns 34 is in a range of 40 nm to 500 nm, for example. The patterning process may include exposing the formed pattern material layer by using yellow light, extreme ultraviolet light, ArF excimer laser, KrF excimer laser, etc., and then performing development.

In an embodiment, in a region corresponding to the end layer 26 (FIG. 1C), a portion not overlapping the auxiliary patterns 34 has an I-beam shape. More specifically, the portion not overlapping the auxiliary patterns 34 includes a first region 34a, a second region 34b, and a third region 34c. The first region 34a is located on a first side of the auxiliary patterns 34 and adjacent to a region corresponding to the main layer 24 (FIG. 1A). The second region 34b is located on a second side of the auxiliary patterns 34 and not adjacent to the region corresponding to the main layer 24 (FIG. 1A). The third region 34c is located between two adjacent auxiliary patterns 34 and connects the first region 34a and the second region 34b. The portion not overlapping the auxiliary patterns 34 is a combination of the first region 34a, the second region 34b, and the third region 34c and shaped like an I-beam. In this embodiment, the area of the first region 34a increases as a distance between the first region 34a and the second end 24b increases. The area of the second region 34b remains substantially unchanged. The distance is measured in the first direction D1 starting from the second end 24b. In an embodiment, the length L1 of the first region 34a and the second region 34b in the first direction D1 and the length L3 of the second region 34b in the second direction D2 are substantially unchanged while the length L2 of the first region 34a in the second direction D2 increases as the distance between the first region 34a and the second end 24b increases.

Figure 2G:
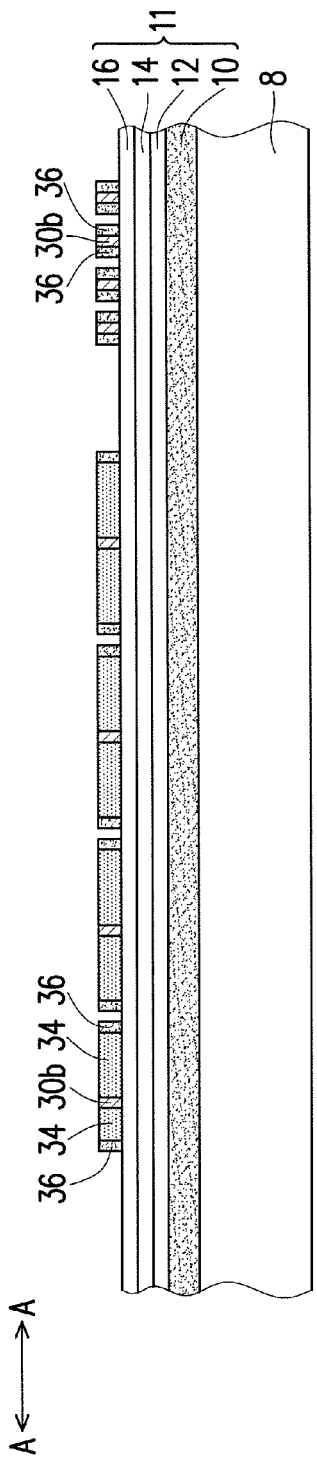
Figure 2H:
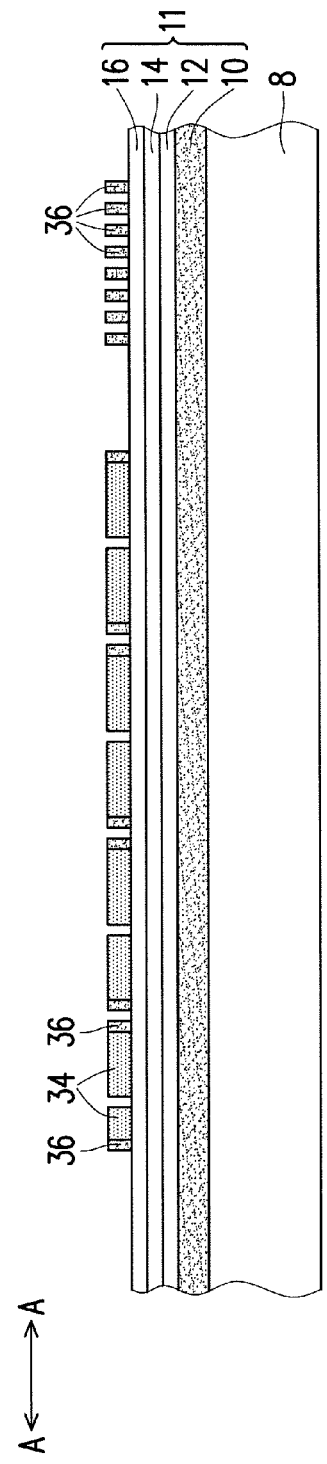
Figure 2K:
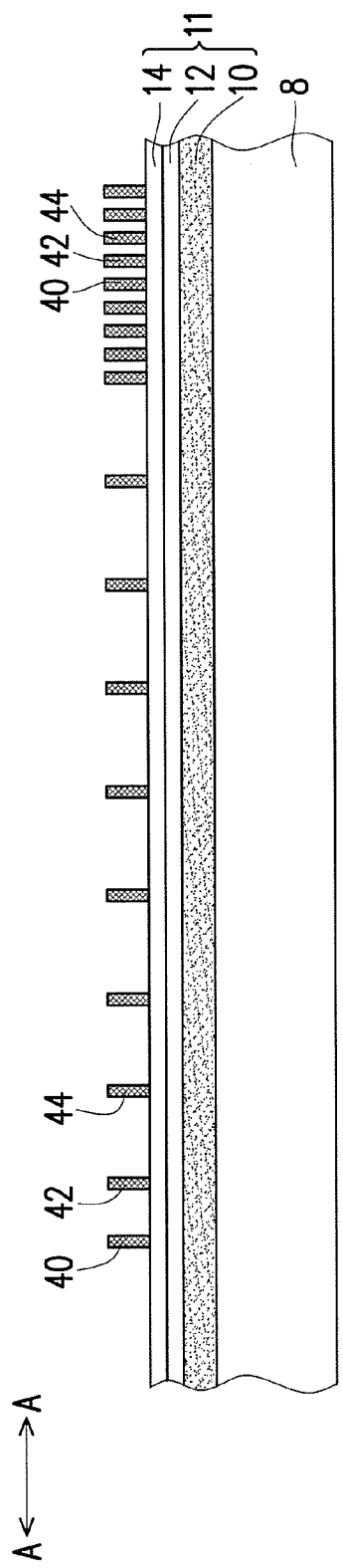
Figure 2L:
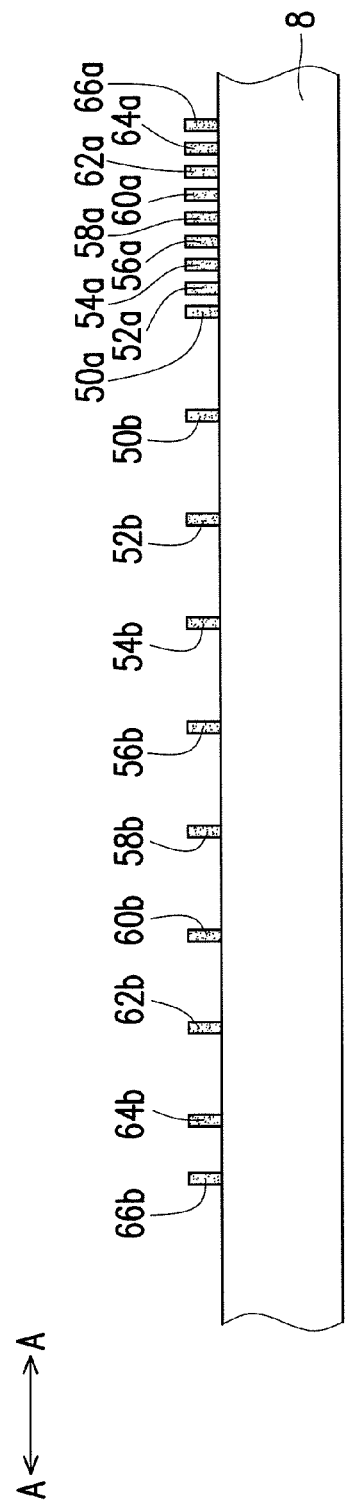

With reference to FIG. 1G and FIG. 2G, next, a second spacer 36 is formed on a sidewall of the first spacer pattern layer 30b and the sidewall of the auxiliary pattern 34. A width of the second spacer 36 is in a range of 10 nm to 40 nm, for example. A material of the second spacer 36 is silicon dioxide, silicon nitride, or a combination thereof, for example. A method of forming the second spacer 36 includes forming a spacer material layer (not shown) and then performing an anisotropic etching process thereon, for example.

With reference to FIG. 1G, FIG. 1H, FIG. 2G and FIG. 2H, thereafter, the first spacer pattern layer 30b is removed. A method of removing the first spacer pattern layer 30b may be the same as or different from the method of removing the core layers 28. A method of removing the first spacer pattern layer 30b may include performing a dry stripping process, a dry etching process, a wet stripping process, a wet etching process, or a combination thereof.

Figure 1I:
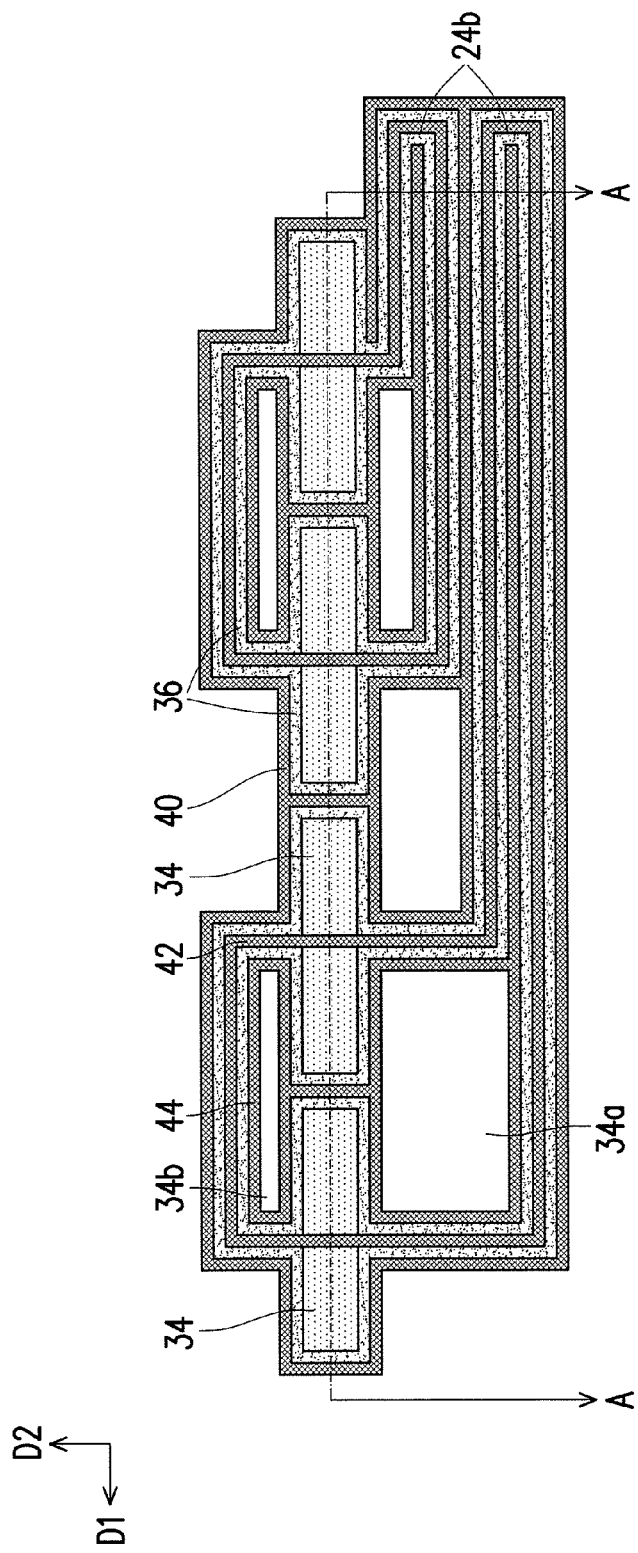
Figure 1J:
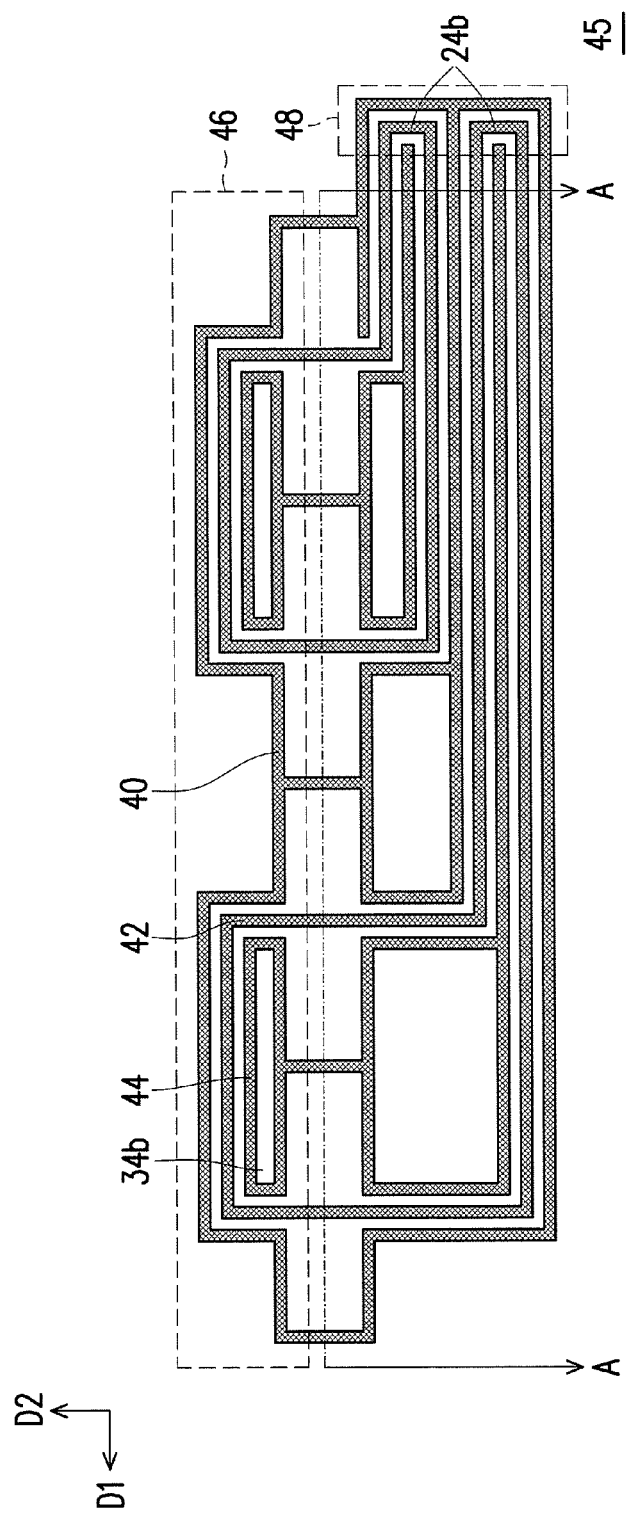
Figure 1K:
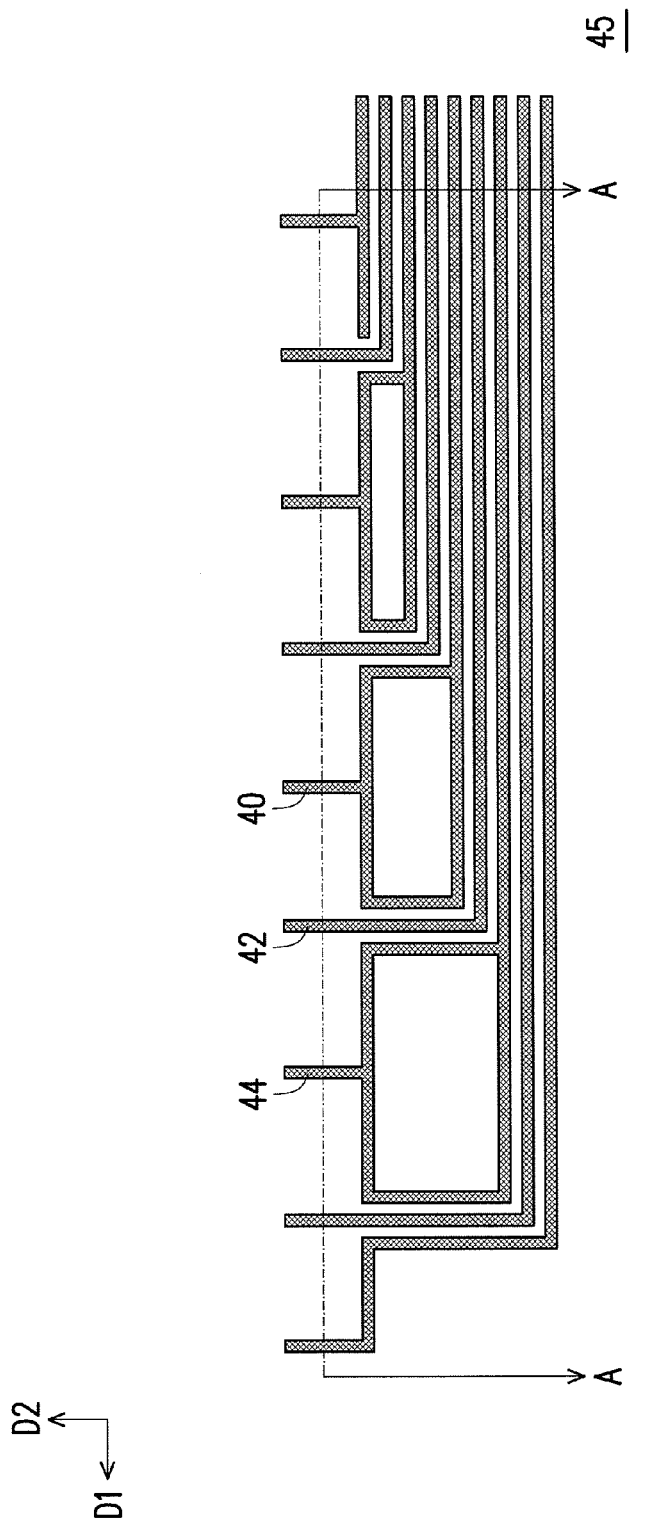

With reference to FIG. 1I and FIG. 2I, next, one or more of the pattern receiver layers under the second spacer 36 and the auxiliary patterns 34 are patterned with the second spacer 36 and the auxiliary patterns 34 as masks, so as to form a patterned layer 16a. In an embodiment, the pattern of the second spacer 36 and the auxiliary patterns 34 is transferred to the polysilicon layer 16 under the second spacer 36 and the auxiliary patterns 34. A patterning method thereof may include performing a dry stripping process, a dry etching process, a wet stripping process, a wet etching process, or a combination thereof.

With reference to FIG. 1I and FIG. 2I again, next, a second spacer pattern layer 42 is formed at a location corresponding to the first spacer pattern layer 30b, and a third spacer 44 and a fourth spacer 40 are formed on a sidewall of the second spacer 36. The third spacer 44 is located in the fourth spacer 40. A width of the third spacer 44 is in a range of 10 nm to 40 nm, and a width of the fourth spacer 40 is in a range of 10 nm to 40 nm, for example. A method of forming the third spacer 44 and the fourth spacer 40 includes forming a spacer material layer (not shown) and then performing an anisotropic etching process thereon, for example. The first spacer 30, the second spacer 36, the third spacer 44, and the fourth spacer 40 may be formed with the same or different widths and formed of the same or different materials. The material of the third spacer 44 and the fourth spacer 40 is silicon dioxide, silicon nitride, or a combination thereof, for example. It should be noted that the spacing between the auxiliary patterns 34 is less than the double of the width of the third spacer 44.

With reference to FIG. 1I, FIG. 1J, FIG. 2I and FIG. 2J, next, the second spacer 36, the auxiliary patterns 34, and the patterned layer 16a are removed to form a closed loop 45. A method of removing the second spacer 36, the auxiliary patterns 34, and the patterned layer 16a may include performing a dry stripping process, a dry etching process, a wet stripping process, a wet etching process, or a combination thereof.

With reference to FIG. 1J, FIG. 1K, FIG. 2J and FIG. 2K, thereafter, a portion of the closed loop 45 is removed to cut the closed loop 45 in a region corresponding to the auxiliary patterns 34 and a region corresponding to the second end 24b. More specifically, the removed portion of the closed loop 45 includes a portion of the second spacer pattern layer 42, the third spacer 44, and the fourth spacer 40. In an embodiment, the removed portion is covered by a first predetermined removal region 46 and a second predetermined removal region 48. More specifically, the first predetermined removal region 46 extends in the first direction D1 and covers a portion of the region corresponding to the auxiliary patterns 34 and a portion of the region corresponding to the end layer 26, but does not cover the region corresponding to the main layer 24. The second predetermined removal region 48 covers the region corresponding to the second end 24b of the main layer 24, but does not cover the region corresponding to the end layer 26 and the region corresponding to the auxiliary patterns 34. A method of removing the portion of the closed loop 45 may be the same as the method of removing the core layers 28. It should be noted that, although this embodiment illustrates that the first predetermined removal region 46 and the second predetermined removal region 48, which are separated from each other, are the removed portion of the closed loop 45, the invention is not limited thereto. The removed portion of the closed loop 45 may be covered by a complete region. More specifically, the removed portion of the closed loop 45 is covered by an L-shaped region, for example.

With reference to FIG. 1K, FIG. 1L, FIG. 2K and FIG. 2L, then, the pattern of the second spacer pattern layer 42, the third spacer 44, and the fourth spacer 40 is transferred to the target layer 10 to form desired lines. A method of transferring the pattern to the target layer 10 includes transferring the pattern of the second spacer pattern layer 42, the third spacer 44, and the fourth spacer 40 to the target layer 10 under the second spacer pattern layer 42, the third spacer 44, and the fourth spacer 40 by performing an etching process with the second spacer pattern layer 42, the third spacer 44, and the fourth spacer 40 as masks, and then removing the second spacer pattern layer 42, the third spacer 44, and the fourth spacer 40 to form the desired lines 50, 52, 54, 56, 58, 60, 62, 64, and 66, for example.

Figure 1L:
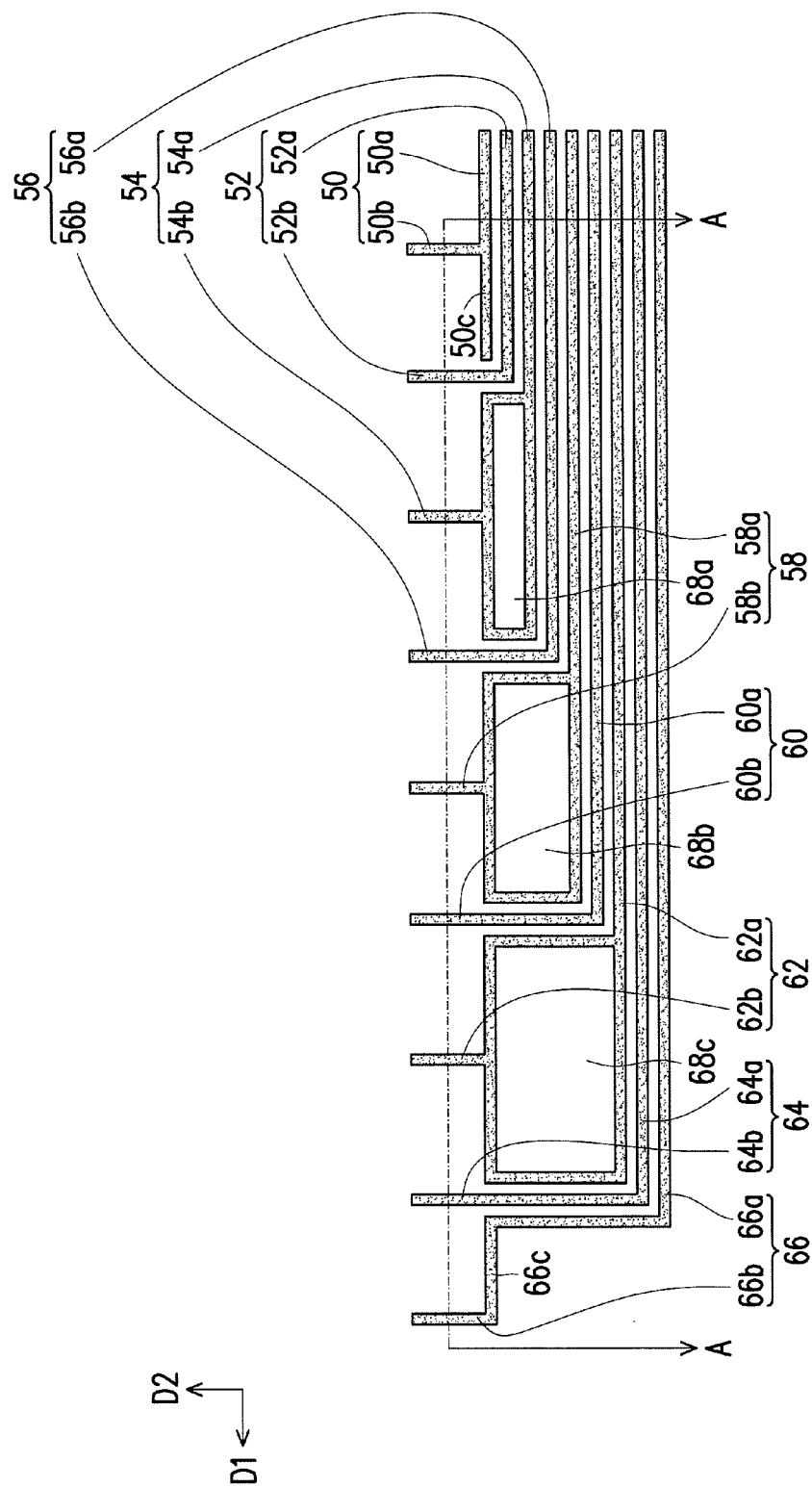
Figure 1M:
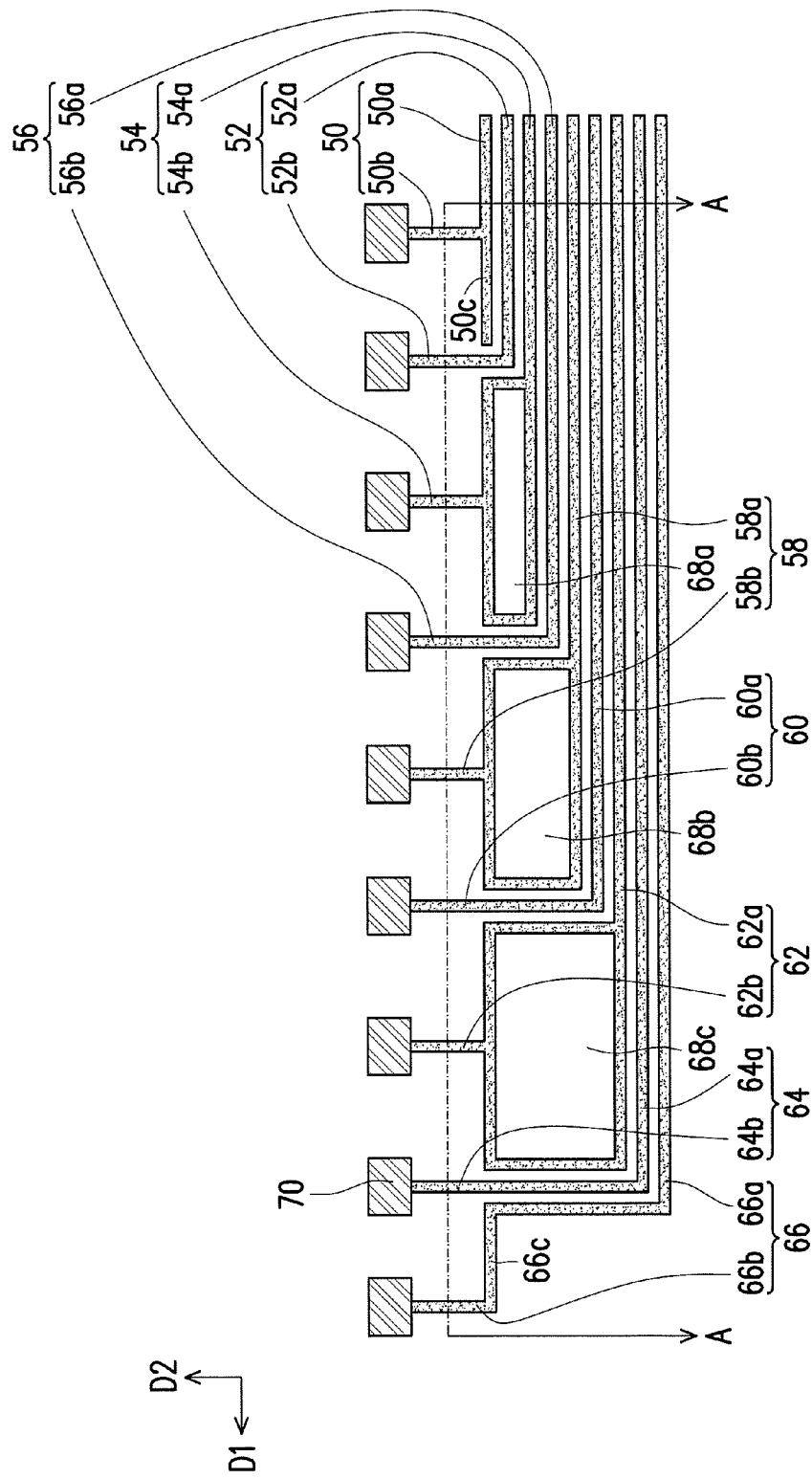

With reference to FIG. 1M, next, a plurality of pads 70 are formed, and the pads 70 are connected with the cut closed loop. A material of the pads 70 includes a metal or a metal alloy, such as copper or copper-nickel alloy, for example. The pads 70 are formed by forming a pad material layer (not shown) by chemical vapor deposition or physical vapor deposition, and then performing a lithography and etching process thereon, for example.

A line layout formed by the aforementioned line layout method of the invention is explained below.

With reference to FIG. 1L and FIG. 1M, the line layout of the invention includes: 4i+1 lines 50, 52, 54, 56, 58, 60, 62, 64, and 66 (i is an integer equal to or greater than 1). The lines 50, 52, 54, 56, 58, 60, 62, 64, and 66 respectively include main portions 50a, 52a, 54a, 56a, 58a, 60a, 62a, 64a, and 66a, and connection portions 50b, 52b, 54b, 56b, 58b, 60b, 62b, 64b, and 66b. The main portions 50a, 52a, 54a, 56a, 58a, 60a, 62a, 64a, and 66a extend in the first direction D1. The connection portions 50b, 52b, 54b, 56b, 58b, 60b, 62b, 64b, and 66b are connected with the main portions 50a, 52a, 54a, 56a, 58a, 60a, 62a, 64a, and 66a, and extend in the second direction D2. In an embodiment, the spacing between the main portions 50a, 52a, 54a, 56a, 58a, 60a, 62a, 64a, and 66a of the lines 50, 52, 54, 56, 58, 60, 62, 64, and 66 is in a range of 10 nm to 40 nm, for example. The spacing between the connection portions 50b, 52b, 54b, 56b, 58b, 60b, 62b, 64b, and 66b of the lines 50, 52, 54, 56, 58, 60, 62, 64, and 66 is in a range of 40 nm to 500 nm, for example. It should be noted that the main portions 54a, 58a, and 62a of the odd-numbered lines 54, 58, and 62 include loop structures 68a, 68b, and 68c respectively, but the first line 50 does not include a loop structure. The number of the lines is counted along the first direction D1 starting from endpoints of the main portions 50a, 52a, 54a, 56a, 58a, 60a, 62a, 64a, and 66a of the lines 50, 52, 54, 56, 58, 60, 62, 64, and 66. The areas surrounded by the loop structures 68a, 68b, and 68c increase as distances between the loop structures 68a, 68b, and 68c and the endpoints of the main portions 50a, 52a, 54a, 56a, 58a, 60a, 62a, 64a, and 66a of the lines 50, 52, 54, 56, 58, 60, 62, 64, and 66 increase. In an embodiment, the lengths of the loop structures 68a, 68b, and 68c in the first direction D1 are substantially fixed while the lengths of the loop structures 68a, 68b, and 68c in the second direction D2 increase as the distances between the loop structures 68a, 68b, and 68c and the endpoints of the main portions 50a, 52a, 54a, 56a, 58a, 60a, 62a, 64a, and 66a of the lines 50, 52, 54, 56, 58, 60, 62, 64, and 66 increase. In an embodiment, the lengths of the loop structures 68a, 68b, and 68c in the first direction D1 are respectively in a range of 80 nm to 800 nm, for example. In addition, the lengths of the connection portions 50b, 54b, 58b, and 62b of the odd-numbered lines 50, 54, 58, and 62 in the second direction D2 are substantially fixed. In an embodiment, the lengths of the connection portions 50b, 54b, 58b, and 62b of the odd-numbered lines 50, 54, 58, and 62 in the second direction D2 are respectively in a range of 20 nm to 500 nm, for example. In the meantime, the lengths of the connection portions 52b, 56b, 60b, and 64b of the even-numbered lines 52, 56, 60, and 64 in the second direction D2 increase as the distances between the connection portions 52b, 56b, 60b, and 64b and the endpoints of the main portions 50a, 52a, 54a, 56a, 58a, 60a, 62a, 64a, and 66a of the lines 50, 52, 54, 56, 58, 60, 62, 64, and 66 increase.

In addition to the configuration of the loop structures 68a, 68b, and 68c, the line layout of the invention further includes a protruding portion 50c at an intersection of the connection portion 50b and the main portion 50a of the first line 50, wherein the protruding portion 50c protrudes toward the connection portion 52b of the adjacent line 52. Furthermore, the last line 66 includes a stepped structure 66c. The even-numbered lines 52, 56, 60, and 64 are in an L shape.

To conclude the above, in the invention, the auxiliary patterns are formed in the region corresponding to the end layer and the portion not overlapping the auxiliary patterns in the region corresponding to the end layer is formed in the I-beam shape. Thus, the spacing between the line ends is increased effectively with use of fewer lithography processes, so as to reduce the production costs and fabrication complexity. In addition, the distance in the transverse direction is maintained sufficient for effectively improving the tolerance for patterning the lines and forming the pads.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A spacer self-aligned quadruple patterning method of a line layout, the spacer self-aligned quadruple patterning method comprising:
   forming i core layers, each comprising:
      a main layer extending in a first direction and comprising a first end and a second end; and
      an end layer connected with the first end of the main layer and protruding in a second direction;

forming a first spacer on a sidewall of each of the core layers;

removing the core layers; and forming 2i auxiliary patterns, wherein i is an integer equal to or greater than 1, and each of the auxiliary patterns extends in the first direction and are spaced and arranged in the first direction, wherein, in a region corresponding to the end layer, a portion not overlapping the auxiliary patterns has an I-beam shape, which comprises a first region adjacent to a region corresponding to the main layer, a second region not adjacent to the region corresponding to the main layer, and a third region connecting the first region and the second region.

2. The spacer self-aligned quadruple patterning method according to claim 1, wherein the area of the first region increases as a distance between the first region and the second end increases, when measured in the first direction starting from the second end.

3. The spacer self-aligned quadruple patterning method according to claim 2, wherein a length of the first region in the first direction is substantially fixed, and a length of the first region in the second direction increases as the distance between the first region and the second end increases.

4. The spacer self-aligned quadruple patterning method according to claim 2, wherein the area of the second region is substantially fixed.

5. The spacer self-aligned quadruple patterning method according to claim 4, wherein the auxiliary patterns are substantially aligned in the first direction.

6. The spacer self-aligned quadruple patterning method according to claim 4, wherein the auxiliary patterns have substantially equal lengths in the second direction.

7. The spacer self-aligned quadruple patterning method according to claim 1, further comprising:

forming a stack structure comprising a plurality of pattern receiver layers;

forming the core layers on the stack structure; and transferring a pattern of the first spacer to one or more of the pattern receiver layers to form a first spacer pattern layer before forming the auxiliary patterns.

8. The spacer self-aligned quadruple patterning method according to claim 7, further comprising:

forming a second spacer on a sidewall of the first spacer pattern layer and a sidewall of each of the auxiliary patterns;

forming a third spacer and a fourth spacer on a sidewall of the second spacer, wherein the third spacer is located in the fourth spacer;

removing the second spacer and the auxiliary patterns to form a closed loop; and removing a portion of the closed loop to cut the closed loop in a region corresponding to the auxiliary patterns and in a region corresponding to the second end.

9. The spacer self-aligned quadruple patterning method according to claim 8, wherein spacing between the auxiliary patterns is less than double of a width of the third spacer.

10. The spacer self-aligned quadruple patterning method according to claim 8, further comprising the following before the step of removing the portion of the closed loop:

removing the first spacer pattern layer before forming the third spacer and the fourth spacer;

patterning one or more of the pattern receiver layers with the second spacer and the auxiliary patterns as masks to form a patterned layer;

forming a second spacer pattern layer at a location corresponding to the first spacer pattern layer; and removing the second spacer, the auxiliary patterns, and the patterned layer.

11. The spacer self-aligned quadruple patterning method according to claim 8, wherein the step of removing the portion of the closed loop comprises:

removing a portion of the second spacer pattern layer, a portion of the third spacer, and a portion of the fourth spacer in a first predetermined removal region and a second predetermined removal region, wherein the first predetermined removal region extends in the first direction and covers a portion of the region corresponding to the auxiliary patterns and a portion of the region corresponding to the end layer, and the first predetermined removal region does not cover the region corresponding to the main layer, the second predetermined removal region covers a region corresponding to the second end of the main layer, and the second predetermined removal region does not cover the region corresponding to the end layer and the region corresponding to the auxiliary patterns.

12. A line layout, comprising:

4i+1 lines, wherein i is an integer equal to or greater than 1, and each of the lines comprises:

a main portion extending in a first direction; and a connection portion connected with the main portion and extending in a second direction, wherein the main portions of a portion of the lines comprise a loop structure respectively.

13. The line layout according to claim 12, wherein, when counted in the first direction starting from an endpoint of the main portion of each of the lines, the main portions of odd-numbered lines comprise the loop structure respectively, wherein a first line of the lines does not comprise the loop structure.

14. The line layout according to claim 13, wherein the area surrounded by the loop structure increases as a distance between the loop structure and the endpoint of the main portion of each of the lines increases.

15. The line layout according to claim 14, wherein a length of the loop structure in the second direction increases as the distance between the loop structure and the endpoint of the main portion of each of the lines increases, and a length of the loop structure in the first direction is substantially fixed.

16. The line layout according to claim 13, wherein a length of the connection portion of each of the odd-numbered lines in the second direction is substantially fixed.

17. The line layout according to claim 13, wherein a length of the connection portion of each of even-numbered lines in the second direction increases as a distance between the connection portion and the endpoint of the main portion of each of the lines increases.

18. The line layout according to claim 13, wherein the first line of the lines comprises a protruding portion at an intersection of the connection portion and the main portion, and the protruding portion protrudes toward the connection portion of the adjacent line.

19. The line layout according to claim 13, wherein a last line of the lines comprises a stepped structure.

20. The line layout according to claim 13, wherein each of the even-numbered lines has an L shape.

* * * * *